United States Patent
Bayat et al.

(10) Patent No.: US 12,027,843 B2
(45) Date of Patent: Jul. 2, 2024

(54) SYSTEMS AND METHODS FOR HIGH-SPEED FALLING CONDUCTOR PROTECTION IN ELECTRIC TRANSMISSION SYSTEMS

(71) Applicant: General Electric Technology GmbH, Baden (CH)

(72) Inventors: Hasan Bayat, Markham (CA); Johannes Kruger, Markham (CA); Yujie Yin, Markham (CA); Mohammad Amin Zamani, Markham (CA); Stéphan D. Picard, Mont-Saint-Hilaire (CA)

(73) Assignee: GE Infrastructure Technology LLC, Greenville, SC (US)

( * ) Notice: Subject to any disclaimer, the term of this patent is extended or adjusted under 35 U.S.C. 154(b) by 0 days.

(21) Appl. No.: 17/475,033

(22) Filed: Sep. 14, 2021

(65) Prior Publication Data
US 2023/0080160 A1 Mar. 16, 2023

(51) Int. Cl.
*H02H 3/44* (2006.01)
*H02H 3/40* (2006.01)

(52) U.S. Cl.
CPC .............. *H02H 3/44* (2013.01); *H02H 3/40* (2013.01)

(58) Field of Classification Search
CPC .............................................. H02H 3/40–407
See application file for complete search history.

(56) References Cited

U.S. PATENT DOCUMENTS 4,377,833 A * 3/1983 Udren ................ H02H 3/40
702/65
9,413,156 B2 8/2016 O'Brien et al.
(Continued)

FOREIGN PATENT DOCUMENTS

CN 105891678 A1 8/2016
WO 2013127438 A1 9/2013

OTHER PUBLICATIONS

Ivanković at al. "Rare Transmission Anomaly and Fault Detection based on Synchrophasors in Control Rooms," 2020 IEEE/PES Transmission and Distribution Conference and Exposition (T&D), Chicago, IL, USA, 2020, pp. 1-5, doi: 10.1109/TD39804.2020.9299985.

(Continued)

*Primary Examiner* — Peter M Novak
(74) *Attorney, Agent, or Firm* — Eversheds Sutherland (US) LLP

(57) ABSTRACT

Systems, methods, and computer-readable media are disclosed for high-speed falling conductor protection in electric distribution systems. An example method may include calculating, by a processor, at a first time, and for each phase, one or more first impedance values associated with one or more terminals of a transmission line. The example method may also include calculating, by the processor, at a second time, and for each phase, one or more second impedance values associated with the one or more terminals. The example method may also include determining, by the processor, that a rate of change of an impedance of the one or more terminals is greater than a threshold rate of change. The example method may also include determining, by the processor and based on the determination that the rate of change of the one or more terminals is greater than the threshold rate of change, that the transmission line has broken. The example method may also include sending, by (Continued)

the processor and based on the determination that the transmission line has broken, a signal to de-energize the transmission line before a broken conductor reaches a ground surface.

17 Claims, 8 Drawing Sheets

(56) References Cited

U.S. PATENT DOCUMENTS

| | | |
|---|---|---|
| 10,365,313 B2 | 7/2019 | Li et al. |
| 2009/0115427 A1 | 5/2009 | Radtke et al. |
| 2017/0264139 A1 | 9/2017 | Perez et al. |
| 2019/0317143 A1* | 10/2019 | Dase ..................... H02H 3/38 |
| 2019/0324074 A1 | 10/2019 | Thompson et al. |
| 2021/0048486 A1 | 2/2021 | Bell et al. |

OTHER PUBLICATIONS

Extended European Search Report issued in EP Application No. 22194887.0, dated Jan. 27, 2023, 8 pages.

* cited by examiner

2

SYSTEMS AND METHODS FOR HIGH-SPEED FALLING CONDUCTOR PROTECTION IN ELECTRIC TRANSMISSION SYSTEMS

FIELD OF DISCLOSURE

The present disclosure is related to power transmission, and more particularly to systems and methods for high-speed falling conductor detection (FCD) or falling conductor protection (FCP) in electric transmission systems.

BACKGROUND

An energized overhead power line can break and fall to the ground or other objects for a variety of reasons such as severe weather conditions, natural disasters, conductor clamp failures, tree fall and/or pole knock-overs. When the falling conductor touches the earth or other grounded objects, it may cause a high-impedance (High-Z) fault which may not be reliably detected by conventional overcurrent protection schemes. Moreover, as the live conductor contacts the ground, the conductor may produce electrical arcing, which can ignite flammable materials or vegetation and start a fire. An undetected High-Z fault is a risk to people and their properties as well as having a potential to evolve into a full-blown fault. Most of the conventional methods are not able to detect all High-Z faults, and operation of the relay for downed conductor faults is not guaranteed. In addition, for the broken or falling conductors, it is expected to detect the condition and trip the corresponding breaker(s) before the conductor touches the ground. Currently, conventional methods for detection of broken falling conductors use electric currents, voltages, and conductor geometry.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Figure 1:
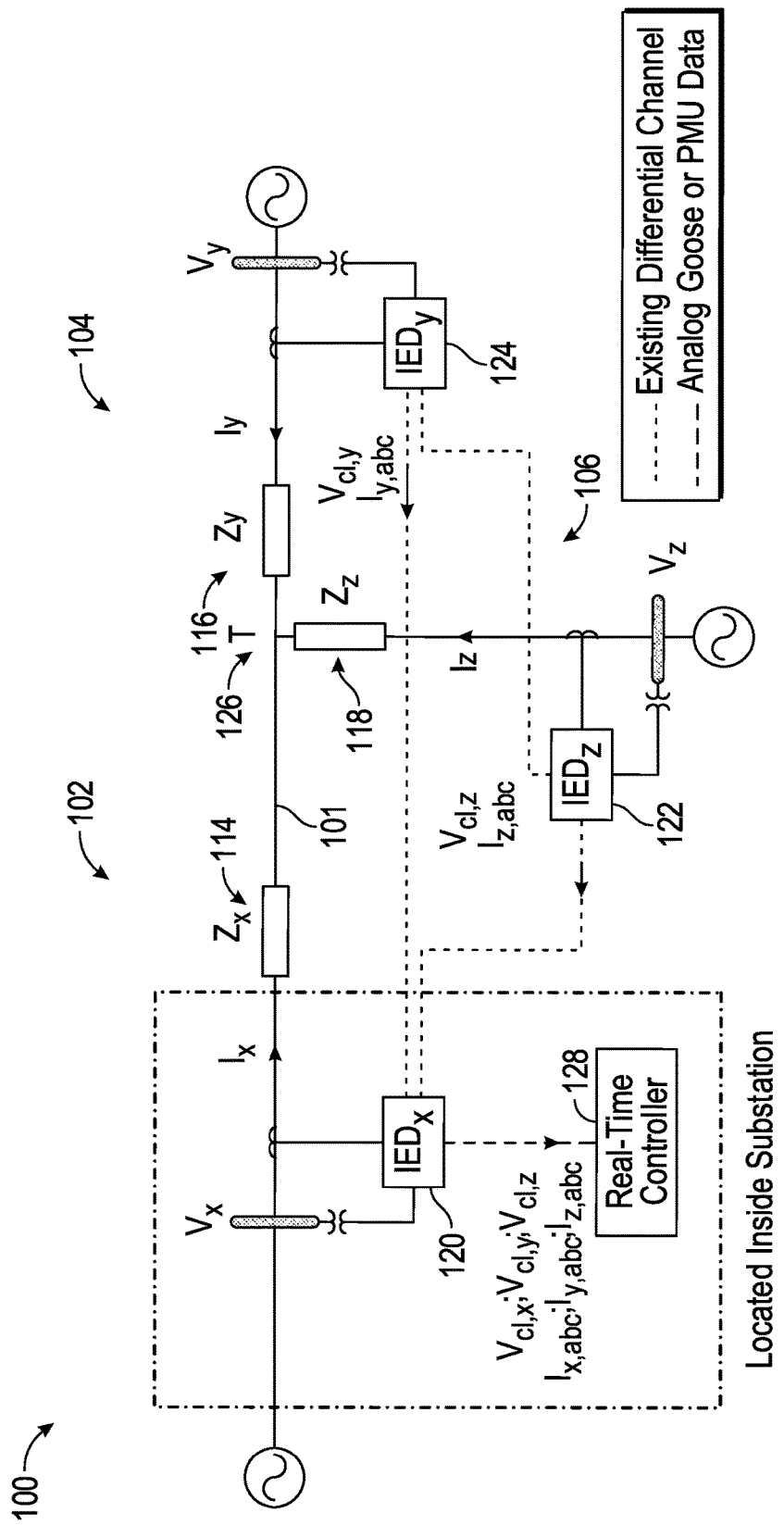
FIG. 1 is a schematic diagram of an example system, in accordance with one or more example embodiments of the disclosure.

This disclosure relates to, among other things, systems, methods, computer-readable media, techniques, and methodologies for high-speed falling conductor detection in electric transmission systems. The algorithm described herein may address the challenges associated with broken conductor detection for two- and three-terminal transmission lines using data received from other end(s) of the transmission line (for example, data, such as voltage and/or current data exchanged between intelligent relays associated with the transmission line). While the descriptions provided herein may be specific to two- and three-terminal transmission lines, similar methods may be applicable to transmission lines with any other number of terminals as well. To ensure that the most updated data is used for detection purposes, the algorithm described herein may also ensure that the data exchanged between relays and/or a centralized controller (described in further detail below) is time synchronized and up-to-date. Additionally, since during a broken conductor scenario a transmission line conductor may typically only take between one and two seconds to hit the ground, the algorithm described herein may be capable of detecting a falling transmission line conductor scenario and de-energize the impacted circuit even prior to the broken conductor reaching the ground (for example, as quickly as about 500 ms after the conductor breaks).

More particularly, the algorithm described herein may represent a transmission falling conductor protection (TFCP) algorithm that may use an impedance change ratio (ICR) based on transmission line impedance(s). The TFCP function may identify a falling conductor condition when the rate of change of impedance for the transmission line exceeds a threshold (which may be at about 15 times the normal value, or any other value). In some cases, the algorithm may be used to detect single-phase broken/open conductors (however, multi-phase broken/open conductors may also be detected in some cases as well). To prevent incorrect operation of the TFCP for a fault happening on the transmission line, a high current threshold may be used to block the TFCP logic if the line current exceeds a predefined value (which may be defaulted at about 1.2 pu, or any other value). The TFCP logic may also be blocked when the phase voltage is outside a pre-defined range at all line terminals, indicating other abnormal scenarios than a broken falling conductor. More specific details relating to the logic of the algorithm may be provided in the description associated with FIG. 4. The transmission line relays may exchange the voltage and current data associated with local and remote line terminals with each other, either via an existing line differential channel or a separate communication medium.

The algorithm may provide more sensitivity in detecting broken falling conductors, when compared to traditional methods for detecting broken falling conductors. Based on the availability of the data, this algorithm may calculate the rate of change of phase impedances, or virtual positive-sequence impedance, and/or virtual Clarke impedance of the line to detect broken conductors on two- or three-terminal transmission lines. Where virtual positive-sequence impedance is defined as the impedance calculated using phase currents and positive-sequence voltage; and virtual Clarke impedance is defined as the impedance calculated using phase currents and Clarke voltage.

The algorithm may include different configurations that may be implemented depending on the type of the data that is captured in a given transmission line system. That is, certain transmission line systems may already be configured to capture certain types of data, and the algorithm may account for this by being able to switch between different configurations that are able to use particular data that is already captured by the given transmission line system. For example, one configuration may be implemented in transmission line systems that capture Clark voltage data. A second configuration may involve a transmission line system that captures positive-sequence voltage data. A third configuration may involve a transmission line system that captures synchrophasor data. The main difference between the third configuration and the two previous configurations may be that the synchrophasor data may not be exchanged between the relays. Instead, the data may be directly streamed to a real-time controller or Phasor Data Concentrator (PDC) to be processed. Consequently, this configuration may require a separate communication channel in addition to the direct differential link that exists between the relays.

The algorithm described herein may provide a number of aspects over conventional methods for quickly detecting broken conductor in transmission lines. First, the algorithm is immune to existing system imbalance and transient events since it is using the ICR over a period of time. Second, the algorithm can work based on available voltage of the remote end of the line. Third, the algorithm can operate within existing transmission line systems that capture different types of data, such as synchrophasor data, positive-sequence voltages, and extended Clarke voltages. Fourth, the algorithm may be implemented using the existing line differential relays. Alternatively, a real-time controller can easily be added to the system to perform centralized processing as well. Fifth, the algorithm may support any number of terminal transmission lines. The proposed method may also be vendor agnostic since all vendors offer multi-ended fault location in their line differential relays and hence communicate voltage values between the relays using C37.94 protocol. The proposed algorithm may also be future proof since it is capable of using PMU data which many system operators have started deploying (similarly, a vendor agnostic approach using standard communication protocols). The algorithm can detect and isolate the broken conductor circuit within about 500 ms, well before the conductor hits the ground. If modifications to the existing relays are not cost effective, adding one real-time controller can cover multiple transmission lines depending on placement and type of available data.

Turning to the figures, FIG. 1 is a schematic diagram of an example system 100, in accordance with one or more example embodiments of the disclosure. The system 100 may include a transmission line 101 including two or more terminals. For example, the particular transmission line 101 illustrated in the figure may include three terminals (a first terminal 102, a second terminal 104, and/or a third terminal 106). Although FIG. 1 depicts a system 100 with three terminals, as mentioned above, the algorithm described herein may similarly apply to a two-terminal system, as well as a system including any other number of terminals as well. Each of the terminals in the system 100 may include at least an intelligent electronic device (IED) (for example, IED 120, IED 122, and/or IED 124), such as a relay. Additionally, each terminal of the transmission line 101 may be associated with a line impedance (for example, line impedance 114, line impedance 116, and/or line impedance 118). Furthermore, the system 100 may also include a real-time controller 128, which may be a centralized controller that may process data received from any of the IEDs. However, the IEDs may also individually, or combined, be able to perform any of the processing as well.

Figure 2:
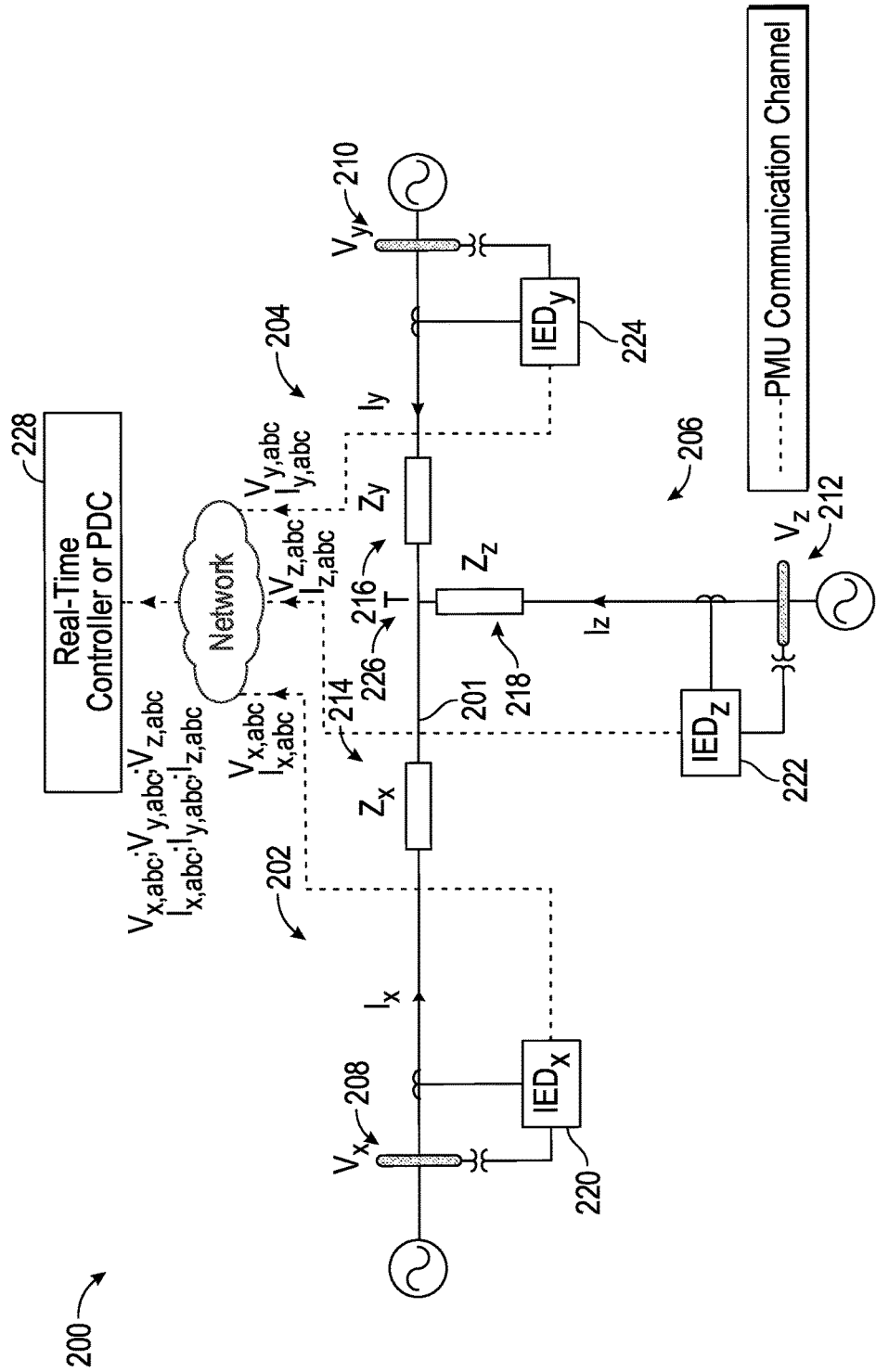
FIG. 2 is a schematic illustration of another example system, in accordance with one or more example embodiments of the disclosure.

FIG. 2 is a schematic illustration of another example system 200, in accordance with one or more example embodiments of the disclosure. The system 200 may be the same as the system 100, however, instead of the IEDs sharing data between one another, the IEDs in the system 200 may instead provide data directly to the real-time controller 228 for processing. In some cases, this configuration may be applicable when synchrophasor data is used in a transmission line system, however, this configuration may also be used for other types of transmission line systems as well.

Figure 3:
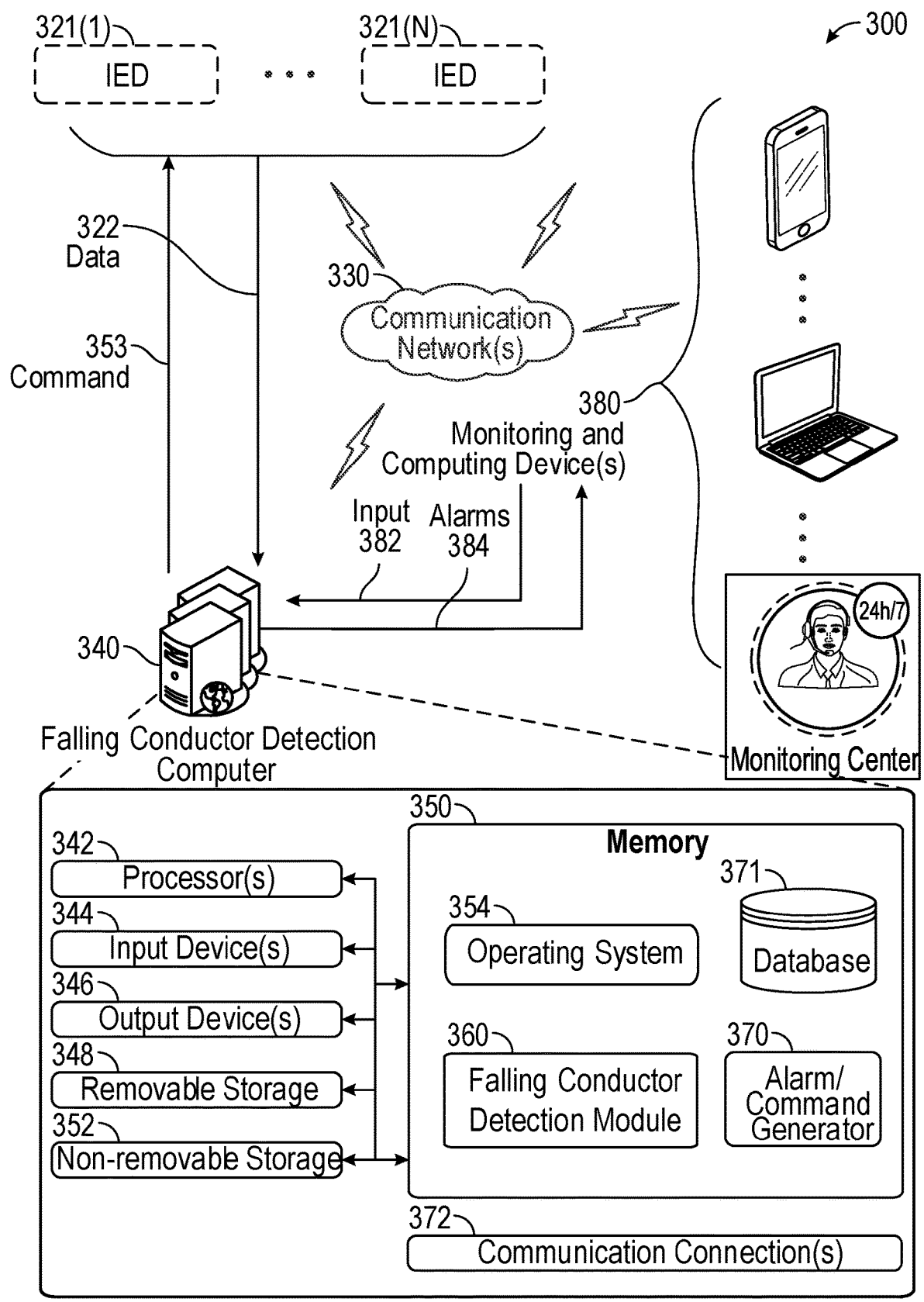
FIG. 3 is a schematic illustration of another example system, in accordance with one or more example embodiments of the disclosure.

FIG. 3 is a schematic illustration of an example falling conductor protection system 300 in accordance with one or more example embodiments of the disclosure.

As shown in FIG. 3, the falling conductor protection system 300 may include one or more IEDs 321(1), . . . , 321(N) (e.g., the IEDs 120-124 of FIG. 1 or 220-224 of FIG. 2), a falling conductor protection controller 340 (e.g., the controller 104 of FIG. 1), and one or more monitoring and computing devices 380.

In an illustrative configuration, an IED may be a protective device configured to measure impedance values of overhead lines. In that case, a distributed architecture may be implemented without a need to an additional real-time controller, when IEDs are time-coordinated with proper margin. Alternatively, an IED may stream out one or more phasor measurements (also referred to as synchrophasor) that may estimate the magnitude and phase angle of an electrical phasor quantity (such as voltage or current) in the overhead lines using a common time source for synchronization, and may also determine the impedance values using the phasor measurements. Examples of an IED may also include a phasor measurement unit (PMU) and/or any suitable device that performs the impedance and/or phasor measurements. The falling conductor protection system 300 may detect broken conductor conditions for multiple lines. In some embodiments, as shown in FIG. 3, the falling conductor protection system 300 may further include two or more IEDs per line, e.g., IEDs 321(1), . . . , 321(N).

The falling conductor protection controller 340 (also referred to as controller 340) may be configured to communicate with two or more IEDs 321, and the one or more monitoring and computing devices 380. The controller 340 may be any type of computing devices, such as, but not limited to, real-time computing devices, real-time gateway devices, computers, and/or servers. The controller 340 may include one or more servers, perhaps arranged in a cluster, as a server farm, or as individual servers not associated with one another.

The controller 340 may include at least a memory 350 and one or more processing units (or processors) 342. The processors 342 may be implemented as appropriate in hardware, software, firmware, or combinations thereof. Software or firmware implementations of the processors 342 may include computer-executable or machine-executable instructions written in any suitable programming language to perform the various functions described (e.g., in real time).

The memory 350 may store program instructions that are loadable and executable on the processors 342, as well as data generated during the execution of these programs. Depending on the configuration and type of the controller 340, the memory 350 may be volatile (such as random access memory (RAM)) and/or non-volatile (such as read-only memory (ROM), flash memory, etc.). The controller 340 or server may also include additional removable storage 348 and/or non-removable storage 352 including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 350 may include multiple different types of memory, such as static random access memory (SRAM), dynamic random access memory (DRAM), or ROM.

The memory 350, the removable storage 348, and the non-removable storage 352 may be all examples of computer-readable storage media. For example, computer-readable storage media may include volatile and non-volatile, removable and non-removable media implemented in any method or technology for the storage of information such as computer-readable instructions, data structures, program modules, or other data. The memory 350, the removable storage 348, and the non-removable storage 352 may be all examples of computer storage media. Additional types of computer storage media that may be present include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the desired information and which can be accessed by the controller 340 or other computing devices. Combinations of any of the above should also be included within the scope of computer-readable media.

Alternatively, computer-readable communication media may include computer-readable instructions, program modules, or other data transmitted within a data signal, such as a carrier wave, or other transmissions. However, as used herein, computer-readable storage media does not include computer-readable communication media.

The controller 340 may also contain communication connection(s) 372 that allows the controller 340 to communicate with a stored database 371, another computing/storage device or server, user terminals, the IEDs 321, the computing devices 380, and/or other devices on the communication network 330. The controller 340 may also include input device(s) 344 such as a keyboard, a mouse, a pen, a voice input device, a touch input device, etc., and output device(s) 346, such as a display, speakers, printers, etc.

Turning to the contents of the memory 350 in more detail, the memory 350 may include an operating system 354 and one or more application programs or services for implementing the features disclosed herein, including, for example, the falling conductor protection module 360 and/or the alarm/command generator 370. The falling conductor protection module 360 and/or the alarm/command generator 370 may be executed to perform any of the operations described herein (for example, operations described with respect to FIGS. 4-6 and 9).

The communication network 330 may transmit or receive data and/or instructions among the IEDs 321, the controller 340, and the monitoring and computing devices 380 using a transmission medium via the network interface device/transceiver utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Ethernet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver may include one or more physical jacks (e.g., Ethernet, coaxial, or phone jacks) or one or more antennas to connect to a communications network. In an example, the network interface device/transceiver may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the IEDs 321, the controller 340, and the monitoring and computing devices 380 and includes digital or analog communications signals or other intangible media to facilitate communication of such software. In some embodiments, the network 330 may include a cable-based network.

Figure 4:
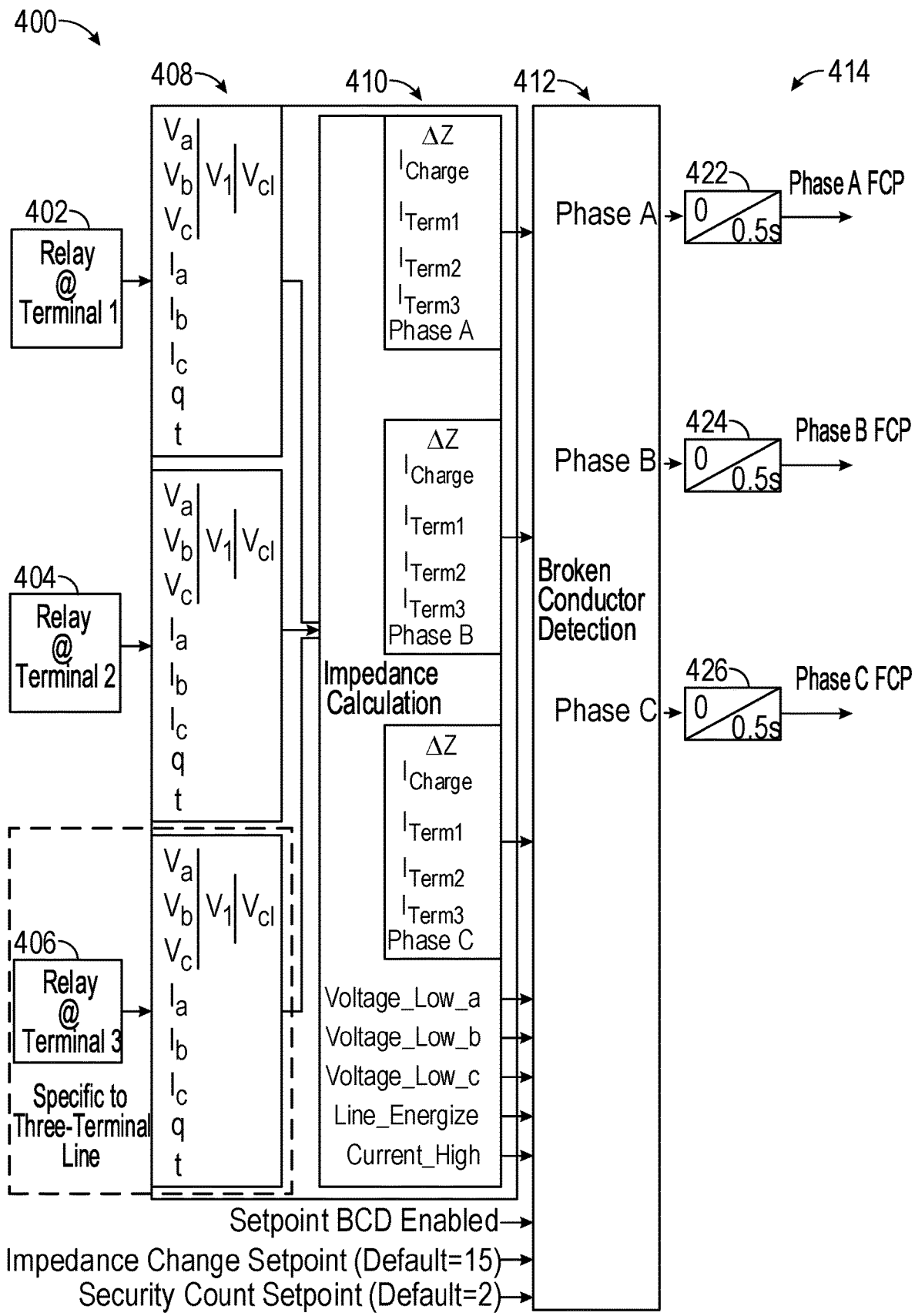
FIG. 4 is a schematic diagram of an example flow diagram, in accordance with one or more example embodiments of the disclosure.

FIG. 4 is a schematic diagram of an example flow diagram 400, in accordance with one or more example embodiments of the disclosure. Particularly, the flow diagram 400 may depict example logic that may be used to perform falling conductor protection in transmission systems as described herein (for example, by using extended Clarke voltage, positive-sequence voltage, and/or synchrophasor data). It should be noted that flow diagram 400 may illustrate logic specific to a three-terminal line. The logic used for a two-terminal line may be similar to the logic presented in the flow diagram 400, but may not include the third terminal. In other words, a two-terminal line may be a reduced version of the three-terminal line. Although not depicted in the figure, this logic for a two-terminal line may also be described in further detail below as well. In flow diagram 400, Va, Vb, and Vc may be voltage synchrophasors, V1 may be a positive-sequence voltage, and Vcl may be an extended Clarke voltage. Variables included in the Equations described below may be defined in Table 1.

TABLE 1

| | |
|---|---|
| $Z_0$; $Z_1$; $Z_2$ | Zero-, positive-, and negative-sequence impedance, respectively |
| $V_0$; $V_1$; $V_2$ | Zero-, positive-, and negative-sequence voltage, respectively |
| $I_0$; $I_1$; $I_2$ | Zero-, positive-, and negative-sequence current, respectively |
| $IED_X$; $IED_Y$; $IED_Z$ | The IED located at terminal X, Y, and Z, respectively |
| $V_x$; $V_y$; $V_z$ | Three-phase voltage at terminal X, Y, and Z, respectively |
| $I_x$; $I_y$; $I_z$ | Three-phase current at terminal X, Y, and Z, respectively |
| $V_{x,a}$; $V_{y,a}$; $V_{z,a}$ | Phase "a" synchrophasor voltage received from terminal X, Y, Z, |
| $V_{x,b}$; $V_{y,b}$; $V_{z,b}$ | Phase "b" synchrophasor voltage received from terminal X, Y, Z, |
| $V_{x,c}$; $V_{y,c}$; $V_{z,c}$ | Phase "c" synchrophasor voltage received from terminal X, Y, Z, |
| $I_{x,a}$; $I_{y,a}$; $I_{z,a}$ | Phase "a" current received from terminal X, Y, Z, respectively |
| $I_{x,b}$; $I_{y,b}$; $I_{z,b}$ | Phase "b" current received from terminal X, Y, Z, respectively |
| $I_{x,c}$; $I_{y,c}$; $I_{z,c}$ | Phase "c" current received from terminal X, Y, Z, respectively |
| $V_{x,1}$; $V_{y,1}$; $V_{z,1}$ | Positive-sequence voltage received from terminal X, Y, Z, |
| $V_{x,cl}$; $V_{y,cl}$; $V_{z,cl}$ | Extended Clarke voltage received from terminal X, Y, Z, |
| $V_a$; $V_b$; $V_c$ | Synchrophasor voltage |
| $V_{cl}$ | Extended Clarke voltage |
| $Z_x$; $Z_y$; $Z_z$ | Line impedance from terminal X, Y, and Z to T-point, respectively |
| $Y_x$; $Y_y$; $Y_z$ | Line admittance from terminal X, Y, and Z to T-point, respectively |
| $R_{yx}$ | Impedance ratio of section y to section x – Ryx = Zy/Zx |
| $R_{xy}$ | Impedance ratio of section x to section y – Rxy = Zx/Zy |
| $R_{yz}$ | Impedance ratio of section y to section z – Ryz=Zy/Zz |
| $R_{zy}$ | Impedance ratio of section z to section y – Rzy=Zz/Zy |
| $R_{xz}$ | Impedance ratio of section x to section z – Rxz = Zx/Zz |
| $R_{zx}$ | Impedance ratio of section z to section x – Rzx = Zz/Zx |
| $Z_{xy,a}$; $Z_{xy,b}$; $Z_{xy,c}$ | Calculated phase a, b, and c impedance for section X using the measurements from terminal Y, respectively |
| $Z_{xz,a}$; $Z_{xz,b}$; $Z_{xz,c}$ | Calculated phase a, b, and c impedance for section X using the measurements from terminal Z, respectively |
| $Z_{yx,a}$; $Z_{yx,b}$; $Z_{yx,c}$ | Calculated phase a, b, and c impedance for section Y using the measurements from terminal X, respectively |
| $Z_{yz,a}$; $Z_{yz,b}$; $Z_{yz,c}$ | Calculated phase a, b, and c impedance for section Y using the measurements from terminal Z, respectively |
| $Z_{zx,a}$; $Z_{zx,b}$; $Z_{zx,c}$ | Calculated phase a, b, and c impedance for section Z using the measurements from terminal X, respectively |
| $Z_{zy,a}$; $Z_{zy,b}$; $Z_{zy,c}$ | Calculated phase a, b, and c impedance for section Z using the measurements from terminal Y, respectively |

In some embodiments, the flow diagram 400 may initiate at block 408 with data being obtained from two or more relays (for example, IEDs) in the transmission line system. For example, data may be obtained from a first relay 402, a second relay 404, a third relay 406, and/or any other number of relays. Once the data is obtained from the two or more relays, block 410 of the flow diagram 400 may involve line impedance calculations. Line protection relays may normally offer multi-ended fault location features, which may require the voltages of the line terminals be exchanged over a direct differential communication channel. As a result, the local voltages may be communicated to the remote line terminal through a direct communication channel (for example, using the IEEE C37.94 standard). The high-speed falling conductor protection described herein uses the existing communicated data between line differential relays to detect a broken/falling conductor. For a three-terminal line, two impedances may be calculated for each phase of the line at each terminal (for example, impedances between the local terminal and two remote terminals). As a result, there may be a total of six and eighteen impedance calculations for a two-terminal and three-terminal lines, respectively.

Figure 6:
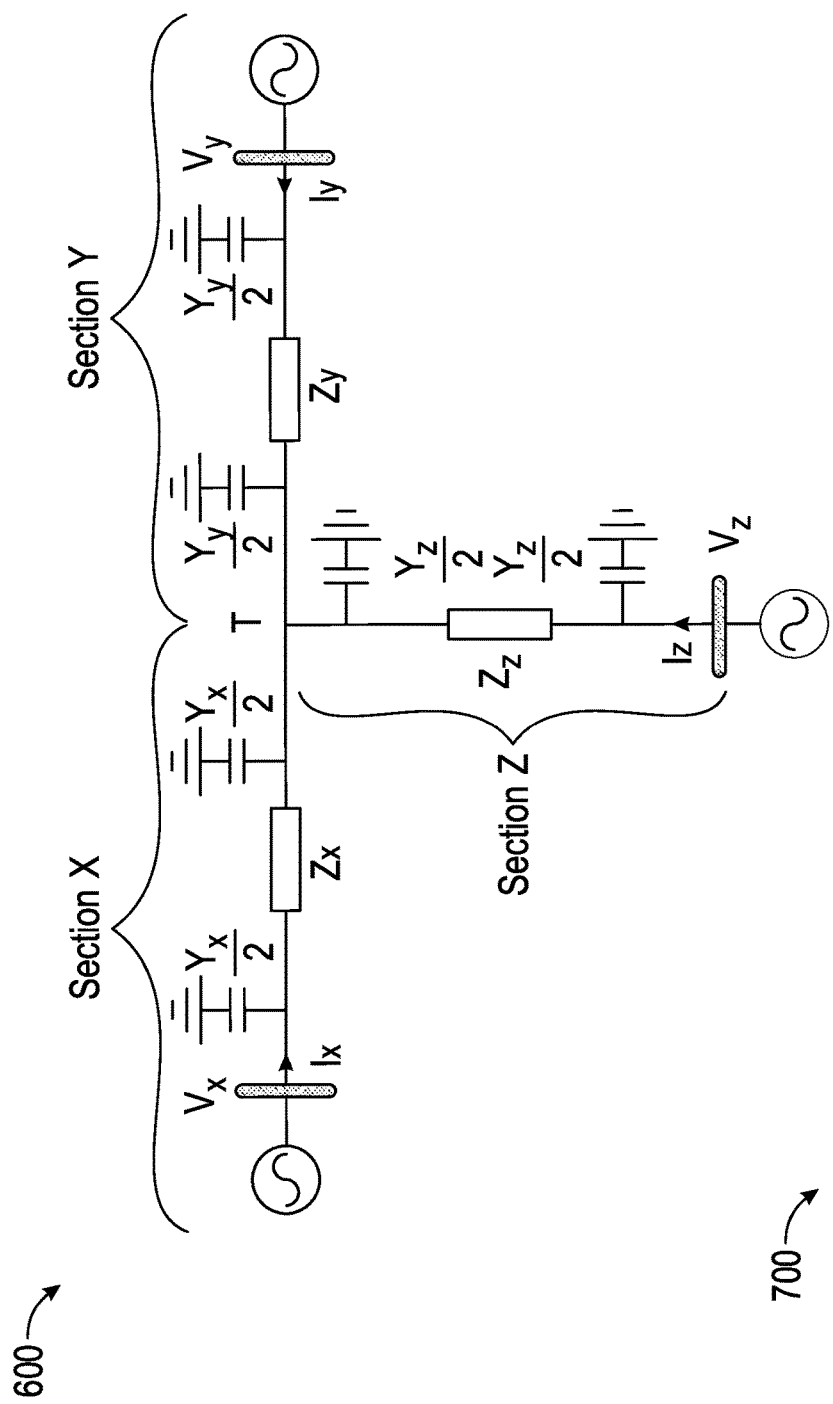
FIG. 6 is a schematic diagram of an example system, in accordance with one or more example embodiments of the disclosure.

As mentioned earlier, for a three-terminal line, two impedances may be calculated for each phase of the system at each line terminal. FIG. 6 may depict of a three-terminal transmission line which may be used to derive the following equations.

The two impedances calculated for each phase of the line at each line terminal use the voltage and current values from the local terminal and the other two remote terminals. The following equations show the derivation of line impedances at one terminal of the line:

$$V_{y,j} - V_{x,j} = \left(I_{y,k} - V_{y,j}\frac{Y_y}{2}\right)Z_y - \left(I_{x,k} - V_{x,j}\frac{Y_x}{2}\right)Z_x \quad \text{(Equation 1)}$$

$$V_{z,j} - V_{x,j} = \left(I_{Z,k} - V_{z,j}\frac{Y_z}{2}\right)Z_z - \left(I_{x,k} - V_{x,j}\frac{Y_x}{2}\right)Z_x \quad \text{(Equation 2)}$$

where k may represent the phase of the line and would take a, b, and c; and index j may represent the type of available voltage data. For example, the index j in any other variables included in Equations 1 and 2 (as well as any other equation described herein) may change depending on the type of data being captured by the relays (as described above, different transmission line systems may capture different types of data). For example, "a," "b," and "c" may be used in place of the index j for synchrophasor data (phase impedance), "1" may be used in place of the index j for positive-sequence voltage (virtual positive-sequence impedance), and "cl" may be used in place of the index j for extended Clarke voltage (virtual Clarke impedance). For terminal X, impedance ratios for different line sections may be defined as:

$$R_{yx} = \frac{Z_y}{Z_x} \quad \text{(Equation 3)}$$

$$R_{zx} = \frac{Z_z}{Z_x} \quad \text{(Equation 4)}$$

Substituting Equations 3 and 4 into Equations 1 and 2, the following relationships may be obtained:

$$V_{y,j} - V_{x,j} = \left(I_{y,k} - V_{y,j}\frac{Y_y}{2}\right)R_{yx}Z_y - \left(I_{x,k} - V_{x,j}\frac{Y_x}{2}\right)Z_x \quad \text{(Equation 5)}$$

$$V_{z,j} - V_{x,j} = \left(I_{Z,k} - V_{z,j}\frac{Y_z}{2}\right)R_{yx}Z_z - \left(I_{x,k} - V_{x,j}\frac{Y_x}{2}\right)Z_x \quad \text{(Equation 6)}$$

Then, for the extended Clarke voltage, the virtual Clarke impedances may be defined at terminal X for various line sections, as shown below (with Equations 7 and 8 representing phase a, Equations 9 and 10 representing phase b, and Equations 11 and 12 representing phase c):

$$Z_{xy,a} = \frac{V_{x,cl} - V_{y,cl}}{I_{x,a} - V_{x,cl}\frac{Y_x}{2} - R_{yx}\left(I_{y,a} - V_{y,cl}\frac{Y_y}{2}\right)} \quad \text{(Equation 7)}$$

$$Z_{xz,a} = \frac{V_{x,cl} - V_{z,cl}}{I_{x,a} - V_{x,cl}\frac{Y_x}{2} - R_{zx}\left(I_{z,a} - V_{z,cl}\frac{Y_z}{2}\right)} \quad \text{(Equation 8)}$$

$$Z_{xy,b} = \frac{V_{x,cl} - V_{y,cl}}{I_{x,b} - V_{x,cl}\frac{Y_x}{2} - R_{yx}\left(I_{y,b} - V_{y,cl}\frac{Y_y}{2}\right)} \quad \text{(Equation 9)}$$

$$Z_{xz,b} = \frac{V_{x,cl} - V_{z,cl}}{I_{x,b} - V_{x,cl}\frac{Y_x}{2} - R_{zx}\left(I_{z,b} - V_{z,cl}\frac{Y_z}{2}\right)} \quad \text{(Equation 10)}$$

$$Z_{xy,c} = \frac{V_{x,cl} - V_{y,cl}}{I_{x,c} - V_{x,cl}\frac{Y_x}{2} - R_{yx}\left(I_{y,c} - V_{y,cl}\frac{Y_y}{2}\right)} \quad \text{(Equation 11)}$$

$$Z_{xz,c} = \frac{V_{x,cl} - V_{y,cl}}{I_{x,c} - V_{x,cl}\frac{Y_x}{2} - R_{zx}\left(I_{z,c} - V_{z,cl}\frac{Y_z}{2}\right)} \quad \text{(Equation 12)}$$

where $Z_{xy,a}$ may represent phase a impedance between terminal X and T point calculated using the data from terminal X and Y, and $Z_{xz,a}$ may represent phase a impedance between terminal X and T point calculated using the data from terminal X and Z. The two impedances for each phase at each line terminal may be calculated continuously. Upon a conductor break, the impedances that are associated with the broken section may rise suddenly indicating the break. A default setting value of about 15 (or any other value) may be used for the impedance ratio change to detect broken falling conductors. Equations 7-12 show the line phase impedances calculated at each end of the line, using a PI equivalent model for the line.

It should be borne in mind the exact impedance calculation may not be necessary for falling conductor detection. However, it may be important to detect the rate of change of impedance for the affected section of the line in order to de-energize the broken line selectively.

Figure 7:
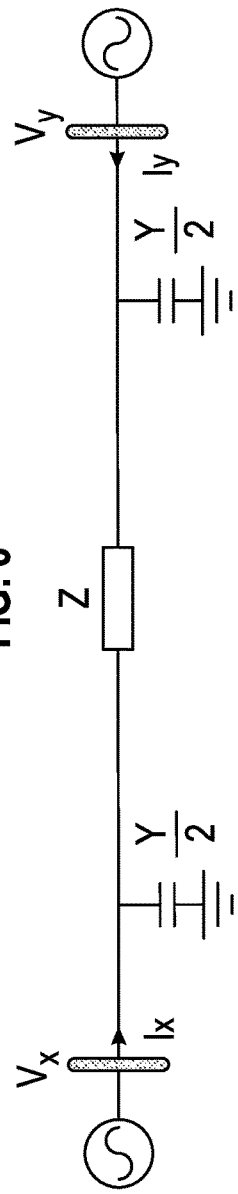
FIG. 7 is a schematic diagram of an example system, in accordance with one or more example embodiments of the disclosure.

The equations presented for calculation of three-terminal line impedances may also be used for two-terminal line with small modifications. Since the Terminal Z does not exist for a two-terminal line, only one impedance may be calculated for each phase at each terminal. Moreover, the length ratio is eliminated from the equations. FIG. 7 shows a simplified PI model for a two-terminal line which may be used to derive the equations.

The following equations are used to calculate the line impedance for a two-terminal line at a local terminal (Terminal X).

$$2(V_{x,j} - V_{y,j}) = Z_{xy,k}\left(I_{x,k} - I_{y,k} - V_{x,j}\frac{Y}{2} + V_{y,j}\frac{Y}{2}\right) \quad \text{(Equation 13)}$$

$$Z_{xy,k} = \frac{2(V_{x,j} - V_{y,j})}{I_{x,k} - I_{y,k} - V_{x,j}\frac{Y}{2} + V_{y,j}\frac{Y}{2}} \quad \text{(Equation 14)}$$

where k may represent the phase of the line and would take a, b, and c; and index j may represent the type of available voltage data, which could be "a", "b", and "c" for phase voltages (PMU data), "1" for positive-sequence voltage, and "cl" for extended Clarke voltage. The following show the equations representing the impedance of a two-terminal line calculated using the PI model and extended Clarke voltage.

$$Z_{xy,a} = \frac{V_{x,cl} - V_{y,cl}}{\frac{I_{x,a} - I_{y,a}}{2} - V_{x,cl}\frac{Y}{4} + V_{y,cl}\frac{Y}{4}} \quad \text{(Equation 15)}$$

$$Z_{xy,b} = \frac{V_{x,cl} - V_{y,cl}}{\frac{I_{x,b} - I_{y,b}}{2} - V_{x,cl}\frac{Y}{4} + V_{y,cl}\frac{Y}{4}} \quad \text{(Equation 16)}$$

$$Z_{xy,c} = \frac{V_{x,cl} - V_{y,cl}}{\frac{I_{x,c} - I_{y,c}}{2} - V_{x,cl}\frac{Y}{4} + V_{y,cl}\frac{Y}{4}} \quad \text{(Equation 17)}$$

Once the line impedances are calculated, the impedance change ratio of the transmission line ($\delta_Z$) may be derived by subtracting the previous impedance Z' (Z'=$Z_{t0-n}$) from the current impedance Z ($Z_{t0}$) and then divided by previous impedance Z', as follows:

$$\delta_Z = \left|\frac{Z - Z'}{Z'}\right| \quad \text{(Equation 18)}$$

Taking Phase 'a' at Terminal X of a three-terminal line as an example, the impedance change ratios ($\delta_{Z_{xy,a}}$ and $\delta_{Z_{xz,a}}$) may be calculated using the following formula (other phases impedance change ratios are calculated similarly):

$$\delta_{Z_{xy,a}} = \left|\frac{Z_{xy,a} - Z'_{xy,a}}{Z'_{xy,a}}\right| \quad \text{(Equation 19)}$$

$$\delta_{Z_{xz,a}} = \left|\frac{Z_{xz,a} - Z'_{xz,a}}{Z'_{xz,a}}\right| \quad \text{(Equation 20)}$$

In some embodiments, once the impedance calculations are performed in block 410, broken conductor detection may be performed at block 412. The TFCP function may identify a falling conductor condition when the rate of change of impedance for the transmission line exceeds a threshold (which may be at about 15 times the normal value, or any other value). In some cases, the algorithm may be used to detect single-phase broken/open conductors (however, multi-phase broken/open conductors may also be detected in some cases as well). To prevent incorrect operation of the TFCP for a fault happening on the transmission line, a high current threshold may be used to block the TFCP logic if the line current exceeds a predefined value (which may be defaulted at about 1.2 pu, or any other value). Additional details about the broken conductor detection performed in block 412 may be described with respect to FIG. 6.

Figure 5:
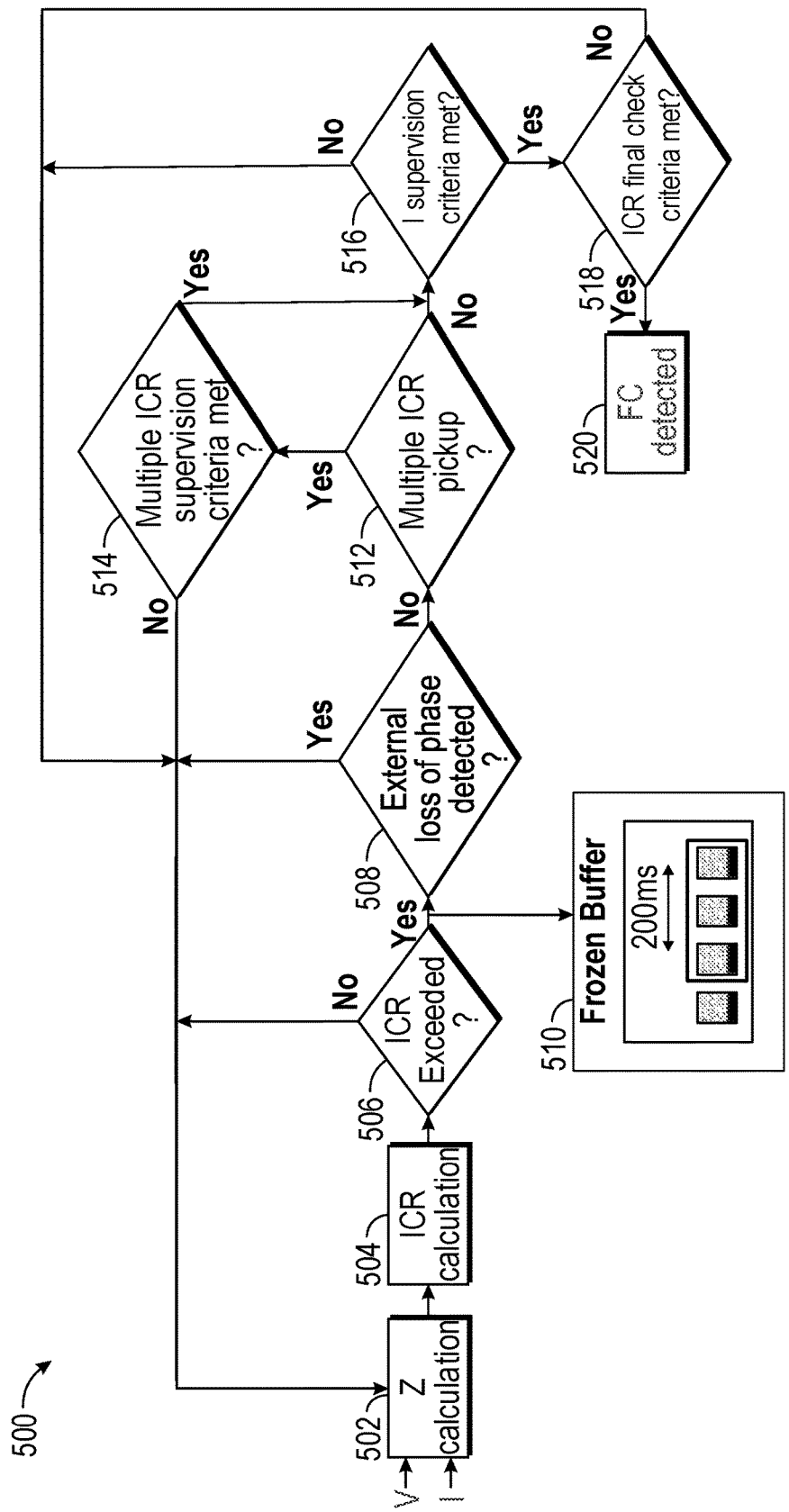
FIG. 5 is a schematic diagram of an example flow diagram, in accordance with one or more example embodiments of the disclosure.

FIG. 5 is a schematic diagram of an example flow diagram 500, in accordance with one or more example embodiments of the disclosure. In some embodiments, the flow diagram 500 may correspond to the falling conductor protection block of FIG. 4. The flow diagram 500 may begin with operation 502. Operation 502 may involve performing one or more impedance calculations. Following operation 502, the flow diagram 500 may proceed to operation 504. Operation 504 may involve performing an ICR calculation (for example, calculations described with respect to FIG. 4 or otherwise herein). In some cases, the ICR calculation may be performed between the latest and third values (or any other value in the buffer) in the moving buffer. The flow diagram 500 may then proceed to condition 506. Condition 506 may involve determining if a change in impedance exceeds a threshold value. If the change in impedance does exceed the threshold value, the flow diagram 500 may proceed to condition 508. Otherwise, the flow diagram 500 may return to operation 502. Additionally, if the change in impedance exceeds the threshold value, then the flow diagram 500 may also proceed to operation 510. Condition 508 may involve determining if an external loss of phase is detected. External loss of phase may be detected if that phase is de-energized at all terminals of the line. This may mean that an upstream/out of protection zone incident has de-energized the phase. Operation 510 may involve freezing a copy of the buffer. The actual buffer may still be receiving data and updating itself during this time. The frozen copy of the buffer provides a snapshot of the time at which the change in impedance exceeded the threshold value.

If an external loss of phase is not detected in condition 508, then the flow diagram 500 may proceed to condition 512. Condition 512 may involve determining if there is more than one phase picked up after a given period of time (for example, about 150 ms or any other amount of time). In some cases, if the ICR of more than one phase is above the threshold, it may need to be determined which phase is actually broken. For example, if a broken conductor happens in phase a, the impedance measured for phase b may change and the ICR may go above the threshold. In this situation, the phase that actually has a broken conductor need to be distinguished from the phase that has experienced a fake change of impedance because of the broken conductor on the other phase. If it is determined that there is not more than one phase picked up, then the flow diagram 500 may proceed to condition 516. However, if it is determined that more than one phase is picked up, then the flow diagram 500 may proceed to condition 514.

Condition 514 may involve performing change in impedance supervision. The phase with an ICR more than a given value greater than the ICR of the other phase may be selected as the phase that actually has the broken conductor. For example, if the threshold value is five, and the ICR of phase a is 16 and the ICR of phase b is 200, then 200 divided by 16 is greater than five and phase b may be selected as the broken phase since its impedance change is significant.

Condition 516 may involve performing current supervision. If condition 516 is met, then the flow diagram 500 may proceed to condition 518. If condition 516 is not met, the flow diagram 500 may proceed back to condition 514. Condition 518 may involve performing a final change in impedance check. The final impedance check may involve comparing the latest sample in the moving buffer with the oldest sample in the frozen buffer, which may be the impedance value before the break in the conductor. If condition 518 is met, then at operation 520, it may be determined that a broken conductor condition is met.

Figure 8:
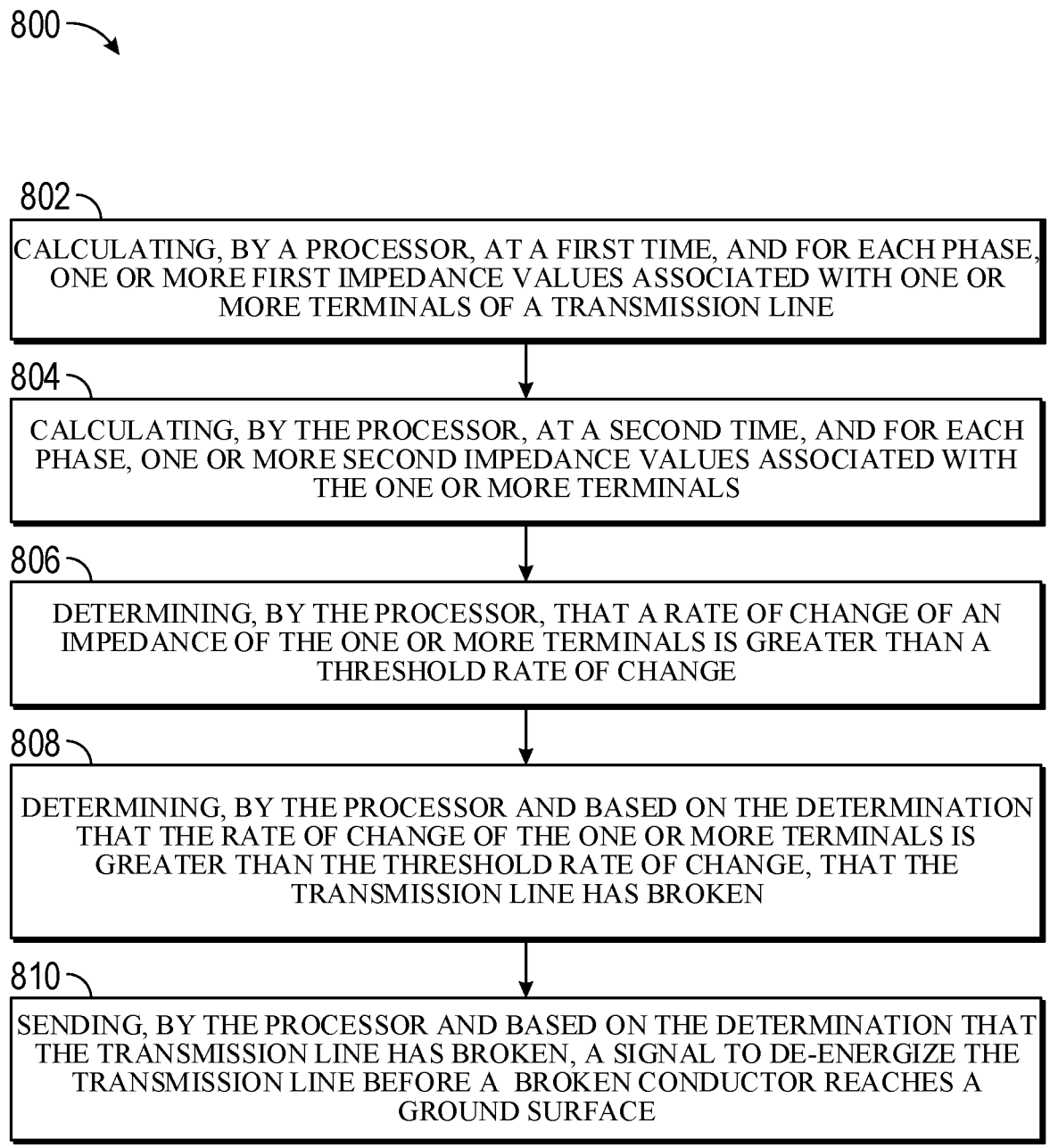
FIG. 8 is a block diagram of an example method, in accordance with one or more example embodiments of the disclosure.

FIG. 8 is an example process flow diagram of an illustrative method 800 for impedance-based broken conductor detection for a two-terminal transmission line in accordance with one or more example embodiments of the disclosure. The method 800 may also be applicable of transmission lines including any other number of terminals as well. In FIG. 8, computer-executable instructions of one or more module(s) (e.g., the controller 128/340) of the falling conductor protection system 100/300 may be executed to perform falling conductor detection and protection. At block 802, the method 800 may include calculating, by a processor, at a first time, and for each phase, one or more first impedance values associated with one or more terminals of a transmission line. At block 804, the method 800 may include calculating, by the processor, at a second time, and for each phase, one or more second impedance values associated with the one or more terminals. At block 806, the method 800 may include determining, by the processor, that a rate of change of an impedance of the one or more terminals is greater than a threshold rate of change. At block 808, the method 800 may include determining, by the processor and based on the determination that the rate of change of the one or more terminals is greater than the threshold rate of change, that the transmission line has broken. At block 810, the method 800 may include sending, by the processor and based on the determination that the transmission line has broken, a signal to de-energize the transmission line before a broken conductor reaches a ground surface.

The operations described and depicted in the illustrative process flow of FIG. 8 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 8 may be performed.

One or more operations of the process flow of FIG. 8 may have been described above as being performed by a user device, or more specifically, by one or more program modules, applications, or the like executing on a device. It should be appreciated, however, that any of the operations of process flow of FIG. 8 may be performed, at least in part, in a distributed manner by one or more other devices, or more specifically, by one or more program modules, applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing. While the operations of the process flow of FIG. 8 may be described in the context of the illustrative broken conductor detection controller, it should be appreciated that such operations may be implemented in connection with numerous other device configurations.

It should further be appreciated that the controller 128/340 may include alternate and/or additional hardware, software, or firmware components beyond those described or depicted without departing from the scope of the disclosure. More particularly, it should be appreciated that software, firmware, or hardware components depicted as forming part of the controller 128/340 are merely illustrative and that some components may not be present or additional components may be provided in various embodiments. While various illustrative program modules have been depicted and described as software modules stored in data storage, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Figure 9:
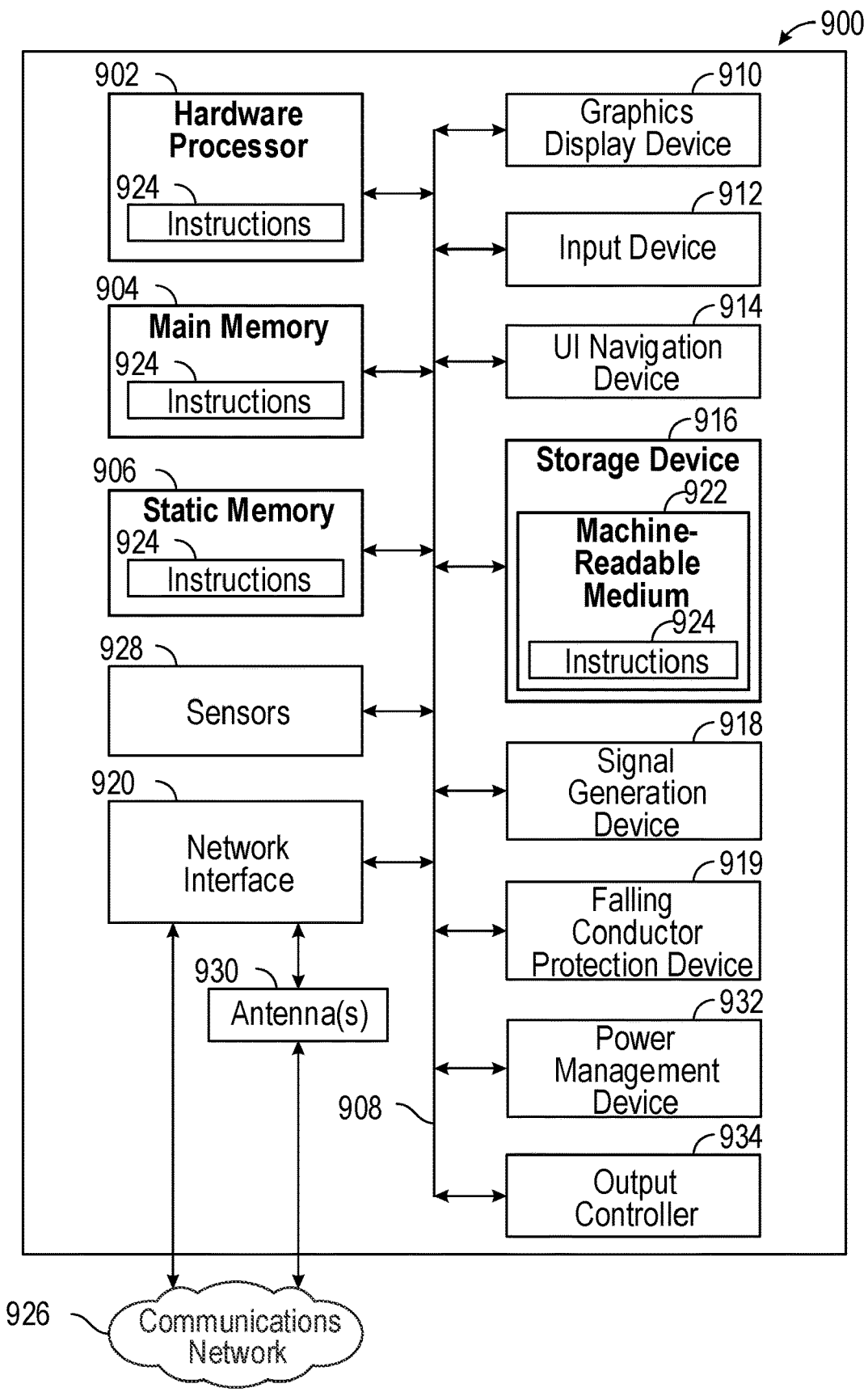
FIG. 9 is a block diagram of an example of a machine or system for high impedance detection, in accordance with one or more example embodiments of the disclosure.

FIG. 9 is a block diagram of an example of a machine or system 900 for falling conductor protection in accordance with one or more example embodiments of the disclosure.

In other embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environments. The machine 900 may be a server (e.g., a real-time server), a computer, an automation controller, a network router, a switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (Saas), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer-readable medium containing instructions where the instructions configure the execution units to carry out a specific operation when in operation. The configuration may occur under the direction of the execution units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 900 may include a hardware processor 902 (e.g., a central processing unit (CPU), a graphics processing unit (GPU), a hardware processor core, or any combination thereof), a main memory 904 and a static memory 906, some or all of which may communicate with each other via an interlink (e.g., bus) 908. The machine 900 may further include a power management device 932, a graphics display device 910, an input device 912 (e.g., a keyboard), and a user interface (UI) navigation device 914 (e.g., a mouse). In an example, the graphics display device 910, input device 912, and UI navigation device 914 may be a touch screen display. The machine 900 may additionally include a storage device (i.e., drive unit) 916, a signal generation device 918 (e.g., an emitter, a speaker), a falling conductor protection device 919, a network interface device/transceiver 920 coupled to antenna(s) 930, and one or more sensors 928, such as a global positioning system (GPS) sensor, a compass, an accelerometer, or other sensor. The machine 900 may include an output controller 934, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 916 may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within the static memory 906, or within the hardware processor 902 during execution thereof by the machine 900. In an example, one or any combination of the hardware processor 902, the main memory 904, the static memory 906, or the storage device 916 may constitute machine-readable media.

The falling conductor protection device 919 may carry out or perform any of the operations and processes (e.g., the flow diagrams 400-500 of FIGS. 4-5 and/or the method 800 of FIG. 8) described above. The falling conductor protection device 919 may be one embodiment of the controller 128/340.

While the machine-readable medium 922 is illustrated as a single medium, the term "machine-readable medium" may include a single medium or multiple media (e.g., a centralized or distributed database, and/or associated caches and servers) configured to store the one or more instructions 924.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 900 and that cause the machine 900 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 924 may further be transmitted or received over a communications network 926 using a transmission medium via the network interface device/transceiver 920 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 920 may include one or more physical jacks (e.g., Ethernet, coaxial, or phone jacks) or one or more antennas to connect to the communications network 926. In an example, the network interface device/transceiver 920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "monitoring and computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

It is understood that the above descriptions are for purposes of illustration and are not meant to be limiting.

Although specific embodiments of the disclosure have been described, numerous other modifications and alternative embodiments are within the scope of the disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could." "might." or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database task or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

The invention claimed is:

1. A method comprising:
   calculating, by a processor, at a first time, and for each phase, one or more first impedance values associated with one or more terminals of a transmission line;
   calculating, by the processor, at a second time, and for each phase, one or more second impedance values associated with the one or more terminals;
   determining, by the processor, using the one or more first impedance values and the one or more second impedance values, a current rate of change of an impedance of a first phase of the transmission line;
   determining, by the processor, a first rate of increase of the impedance of the first phase based on a ratio between the current rate of change of the impedance and a prior rate of change of the impedance;
   determining, by the processor, that the first rate of increase of the impedance of the first phase and a second rate of increase of a second impedance of a second phase of the transmission line are both greater than a threshold rate of change;

comparing, by the processor, the first rate of increase of the impedance of the first phase to the second rate of increase of the second impedance of the second phase;

determining, by the processor, based on the comparison of the first rate of increase of the impedance of the first phase to the second rate of increase of the second impedance of the second phase, that the first rate of increase is greater than the second rate of increase;

determining, by the processor and based on the determination that the first rate of increase of the first phase is greater than the threshold rate of change, that the transmission line has broken;

selecting, by the processor, based on determining that the first rate of increase is greater than the second rate of increase, the first phase instead of the second phase as a broken phase of the transmission line; and sending, by the processor and based on selecting the first phase as the broken phase, a signal to de-energize the first phase of the transmission line, instead of the second phase of the transmission line, before the broken phase of the transmission line reaches a ground surface.

2. The method of claim 1, wherein determining the current rate of change of the impedance is based on a ratio of a difference between a voltage of the one or more terminals and a difference between a current of the one or more terminals.

3. The method of claim 1, wherein determining that the first rate of increase and the second rate of increase are both greater than the threshold rate of change is based on a moving buffer.

4. The method of claim 1, wherein the one or more terminals includes either two terminals or three terminals.

5. The method of claim 1, wherein calculating the one or more first impedance values is based on data received from one or more intelligent electronic devices (IEDs) of the transmission line.

6. The method of claim 5, wherein the data includes at least one of: a Clarke voltage, a positive-sequence voltage, or synchrophasor data.

7. A system comprising:
a computer processor operable to execute a set of computer-executable instructions; and
memory operable to store the set of computer-executable instructions operable to:
calculate, at a first time, for each phase, and based on a Clarke voltages, one or more first impedance values associated with one or more terminals of a transmission line;
calculate, at a second time and for each phase, one or more second impedance values associated with the one or more terminals;
determine, using the one or more first impedance values and the one or more second impedance values, a current rate of change of an impedance of a first phase of the transmission line;
determine a first rate of increase of the impedance of the first phase based on a ratio between the current rate of change of the impedance and a prior rate of change of the impedance;
determine, that the first rate of increase of the impedance of the first phase and a second rate of increase of a second impedance of a second phase of the transmission line are both greater than a threshold rate of change;
compare the first rate of increase of the impedance of the first phase to the second rate of increase of the second impedance of the second phase;
determine, based on the comparison of the first rate of increase of the impedance of the first phase to the second rate of increase of the second impedance of the second phase, that the first rate of increase is greater than the second rate of increase;
determine, based on the determination that the first rate of increase of the first phase is greater than the threshold rate of change, that the transmission line has broken;
select, based on determining that the first rate of increase is greater than the second rate of increase, the first phase instead of the second phase as a broken phase of the transmission line; and
send, based on selecting the first phase as the broken phase, a signal to de-energize the first phase of the transmission line, instead of the second phase of the transmission line, before the broken phase of the transmission line reaches a ground surface.

8. The system of claim 7, wherein determining the current rate of change of the impedance is based on a ratio of a difference between a voltage of the one or more terminals and a difference between a current of the one or more terminals.

9. The system of claim 7, wherein determining that the first rate of increase and the second rate of increase are both greater than the threshold rate of change is based on a moving buffer.

10. The system of claim 7, wherein the one or more terminals includes either two terminals or three terminals.

11. The system of claim 7, wherein calculating the one or more first impedance values is based on data received from one or more intelligent electronic devices (IEDs) of the transmission line.

12. The system of claim 11, wherein the data includes at least one of: a positive-sequence voltage or synchrophasor data.

13. A non-transitory computer-readable medium storing computer-executable instructions, that when executed by at least one processor, cause the at least one processor to:
calculate, at a first time and for each phase, one or more first impedance values associated with one or more terminals of a transmission line;
calculate, at a second time and for each phase, one or more second impedance values associated with the one or more terminals;
determine, using the one or more first impedance values and the one or more second impedance values, a current rate of change of an impedance of a first phase of the transmission line;
determine a first rate of increase of the impedance of the first phase based on a ratio between the current rate of change of the impedance and a prior rate of change of the impedance;
determine, that the first rate of increase of the impedance of the first phase and a second rate of increase of a second impedance of a second phase of the transmission line are both greater than a threshold rate of change;
compare the first rate of increase of the impedance of the first phase to the second rate of increase of the second impedance of the second phase;
determine, based on the comparison of the first rate of increase of the impedance of the first phase to the second rate of increase of the second impedance of the second phase, that the first rate of increase is greater than the second rate of increase;

determine, based on the determination that the first rate of increase of the first phase is greater than the threshold rate of change, that the transmission line has broken;

determine select, based on determining that the first rate of increase is greater than the second rate of increase, the first phase instead of the second phase as a broken phase of the transmission line; and send, based on selecting the first phase as the broken phase, a signal to de-energize the first phase of the transmission line, instead of the second phase of the transmission line, before the broken phase of the transmission line reaches a ground surface.

14. The non-transitory computer-readable medium of claim 13, wherein determining the current rate of change of the impedance is based on a ratio of a difference between a voltage of the one or more terminals and a difference between a current of the one or more terminals.

15. The non-transitory computer-readable medium of claim 13, wherein determining that the first rate of increase and the second rate of increase are both greater than the threshold rate of change is based on a moving buffer.

16. The non-transitory computer-readable medium of claim 13, wherein the one or more terminals includes either two terminals or three terminals.

17. The non-transitory computer-readable medium of claim 13, wherein calculating the one or more first impedance values is based on data received from one or more intelligent electronic devices (IEDs) of the transmission line.

* * * * *